US006587377B2

(12) United States Patent
Ichikawa

(10) Patent No.: US 6,587,377 B2
(45) Date of Patent: Jul. 1, 2003

(54) NONVOLATILE SEMICONDUCTOR MEMORY DEVICE WITH RELIABLE VERIFY OPERATION

(75) Inventor: Takaaki Ichikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 33 days.

(21) Appl. No.: 09/810,496

(22) Filed: Mar. 19, 2001

(65) Prior Publication Data
US 2002/0131300 A1 Sep. 19, 2002

(30) Foreign Application Priority Data
Nov. 22, 2000 (JP) ........................................ 2000-356009

(51) Int. Cl.$^7$ ............................................. G11C 16/06
(52) U.S. Cl. ............................. 365/185.2; 365/185.24; 365/200; 365/201; 365/205; 365/207; 365/208
(58) Field of Search ....................... 365/185.2, 185.24, 365/200, 201, 205, 207, 208

(56) References Cited

U.S. PATENT DOCUMENTS

| 5,091,888 A | * | 2/1992 | Akaogi ........................ 365/210 |
| 5,444,656 A | * | 8/1995 | Bauer et al. ............... 365/189.01 |
| 6,215,697 B1 | * | 4/2001 | Lu et al. .................. 365/185.03 |
| 6,337,825 B2 | * | 1/2002 | Tanzawa et al. ............ 365/207 |

FOREIGN PATENT DOCUMENTS

| JP | 9-181279 | 7/1997 |
| JP | 10-261768 | 9/1998 |

* cited by examiner

Primary Examiner—David Nelms
Assistant Examiner—Connie C. Yoha
(74) Attorney, Agent, or Firm—Arent Fox Kintner Plotkin & Kahn, PLLC

(57) ABSTRACT

A nonvolatile semiconductor memory device includes a reference circuit which includes a plurality of reference cell transistors connected together and receiving a common gate voltage, and includes a signal line having an electric current running therethrough that is a composite of electric currents running through the reference cell transistors in accordance with the gate voltage. The semiconductor memory device further includes a memory cell array which include memory cells for storing data therein, a comparison circuit which compares the electric current running through the signal line with an electric current corresponding to data of one of the memory cells, and a threshold value setting circuit which adjusts threshold voltage levels of one or more of the reference cell transistors so as to bring a voltage versus current characteristic curve of the gate voltage and the electric current running through the signal line closer to a voltage versus current characteristic curve of the memory cells.

9 Claims, 9 Drawing Sheets

NONVOLATILE SEMICONDUCTOR MEMORY DEVICE WITH RELIABLE VERIFY OPERATION

BACKGROUND OF THE INVENTION

1. Field of the Invention

The present invention generally relates to semiconductor memory devices, and particularly relates to a nonvolatile semiconductor memory device which compares data with a level of a reference cell before outputting the data.

2. Description of the Related Art

When data is to be read from a nonvolatile semiconductor memory device, an electric current running through a memory cell transistor is compared with an electric current running through a reference cell transistor, and a HIGH/LOW status of the data is determined based on the comparison. In this configuration, the Vg-Id characteristic (i.e., gate voltage versus drain current characteristic) of a memory cell transistor is preferably the same shape as the Vg-Id characteristic of the reference cell transistor with only a horizontal shift of position.

FIG. 1 is a diagram showing Vg-Id characteristics of cell transistors under an ideal situation.

In FIG. 1, a Vg-Id characteristic curve 10 is that of a reference cell transistor. A Vg-Id characteristic curve 11 is that of a memory cell transistor that is in the erased state, and, thus, stores therein data "1". A Vg-Id characteristic curve 12 is that of a memory cell transistor that is in the programmed state, and, thus, stores therein data "0".

When a read voltage WL is applied to the gate of the memory cell transistor, and a voltage WL_ref is applied to the gate of the reference cell transistor, each cell has an electric current passing therethrough that is commensurate with the gate voltage applied thereto. In FIG. 1, the gate voltages WL and WL_ref are identical and represented by a vertical dotted line. An electric current passes through each transistor in an amount corresponding to the position of the intersection where the characteristic curve meets the dotted line.

In FIG. 1, the Vg-Id characteristic curve of each cell transistor has the same curve shape. In this case, the amounts of electric currents corresponding to the gate voltages WL and WL_ref differ from each other by a sufficient margin, so that reliable data read operation is achieved. Namely, a sufficient margin can be secured even if there are power supply voltage fluctuation and various noises.

In reality, however, the memory cell transistor and the reference cell transistor are not formed within the same array, but are formed at different locations inside a semiconductor chip. Because of this, they may have Vg-Id characteristic curves whose shapes are different from each other.

FIG. 2 is a diagram showing Vg-Id characteristics of cell transistors under a situation that is not ideal.

In FIG. 2, the Vg-Id characteristic curve 11 is that of a memory cell transistor that stores therein data "1", and the Vg-Id characteristic curve 12 is that of a memory cell transistor that stored therein data "0". A Vg-Id characteristic curve 10a and a Vg-Id characteristic curve 10b are that of a reference cell transistor. The Vg-Id characteristic curve 10a corresponds to a case in which the slope of the curve is greater than that of the characteristic curve of the memory cell transistor. The Vg-Id characteristic curve 10b corresponds to a case in which the slope of the curve is smaller than that of the characteristic curve of the memory cell transistor.

When the read voltage WL is applied to the gate of the memory cell transistor, and the voltage WL_ref is applied to the gate of the reference cell transistor, each cell has an electric current passing therethrough that corresponds to the position of the intersection where the characteristic curve meets the dotted line.

In FIG. 2, the reference cell has the Vg-Id characteristic curve that is a different shape from the Vg-Id characteristic curve of the memory cell. In this case, the amounts of electric currents corresponding to the gate voltages WL and WL_ref may not have a sufficient difference between the memory cell and the reference cell. Accordingly, it is difficult to secure sufficient margin in the presence of power supply voltage fluctuation and various noises.

Accordingly, there is a need for a semiconductor memory device which can adjust the slope of the Vg-Id characteristic curve of the reference cell so as to make it conform to the Vg-Id characteristic curve of the memory cell.

SUMMARY OF THE INVENTION

It is a general object of the present invention to provide a nonvolatile semiconductor memory device that substantially obviates one or more of the problems caused by the limitations and disadvantages of the related art.

It is another and more specific object of the present invention to provide a semiconductor memory device which can adjust the slope of the Vg-Id characteristic curve of the reference cell so as to make it conform to the Vg-Id characteristic curve of the memory cell.

In order to achieve the above objects according to the present invention, a nonvolatile semiconductor memory device includes a reference circuit which includes a plurality of reference cell transistors connected together and receiving a common gate voltage, and includes a signal line having an electric current running therethrough that is a composite of electric currents running through the reference cell transistors in accordance with the gate voltage, a memory cell array which includes memory cells for storing data therein, a comparison circuit which compares the electric current running through the signal line with an electric current corresponding to data of one of the memory cells, and a threshold value setting circuit which adjusts threshold voltage levels of one or more of the reference cell transistors so as to bring a voltage versus current characteristic curve of the gate voltage and the electric current running through the signal line closer to a voltage versus current characteristic curve of the memory cells.

In the semiconductor memory device as described above, a composite of the electric currents running through the reference cell transistors is used as an electric current that is compared with memory cell data. Adjustment of threshold voltage levels of the reference cell transistors makes it possible to freely set the slope of the voltage versus current characteristic curve.

In one embodiment of the present invention, the reference cell transistors of the reference circuit include a first reference cell transistor, a second reference cell transistor connected in series to the first reference cell transistor, and a third reference cell transistor connected in parallel to the series connection of the first reference cell transistor and the second reference cell transistor, wherein the electric current running through the signal line is a sum of an electric current running through the series connection and an electric current running through the third reference cell transistor.

In another embodiment, the reference cell transistors of the reference circuit include a first reference cell transistor, a second reference cell transistor connected in series to the first reference cell transistor, and a third reference cell transistor connected in parallel to the first reference cell transistor, wherein the electric current running through the signal line is an electric current running through the second reference cell transistor.

In the configurations described above, threshold voltage levels Vt0, Vt1, and Vt2 of the first, second, and third respective reference cell transistors are set such that Vt1<Vt0<Vt2. Then, one of the threshold voltage levels Vt1 and Vt2 is adjusted while maintaining Vt1<Vt0<Vt2, thereby adjusting a slope of a voltage versus current characteristic defined by the gate voltage and the electric current running through the signal line.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
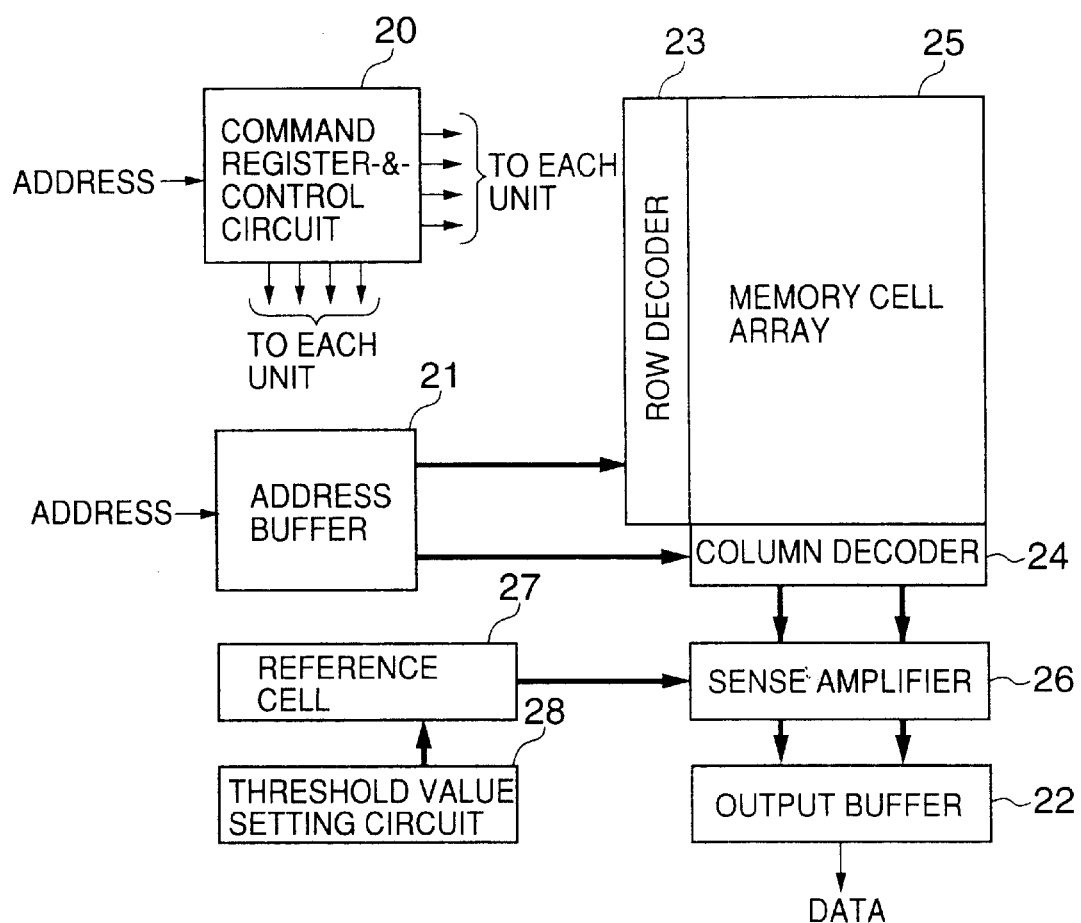
FIG. 3 is a block diagram of a semiconductor memory device according to the present invention.

FIG. 3 is a block diagram of a semiconductor memory device according to the present invention.

The semiconductor memory device of FIG. 3 includes a command register-&-control circuit 20, an address buffer 21, an output buffer 22, a row decoder 23, a column decoder 24, a memory cell array 25, a sense amplifier 26, a reference cell 27, and a threshold value setting circuit 28.

The command register-&-control circuit 20 receives control signals and commands from an exterior of the semiconductor memory device, and serves as a command register to store a command therein. Further, the command register-&-control circuit 20 operates as a state machine in accordance with the control signals and command, thereby controlling operation of each unit provided in the semiconductor memory device.

The address buffer 21 receives address signals from the exterior of the semiconductor memory device, and supplies the address signals to the row decoder 23 and the column decoder 24. The row decoder 23 decodes the address supplied from the address buffer 21, and activates a word line provided in the memory cell array 25 in response to the decoded results. The column decoder 24 decodes the address supplied from the address buffer 21, and selectively couples bit lines of the memory cell array 25 to the sense amplifier (comparison circuit) 26 in accordance with the decoded address signals. This establishes data paths for the memory cell array 25 in term of data read/write operations.

The memory cell array 25 includes an array of memory cells, word lines, bit lines, etc., and stores data in each memory cell. In the data read operation, data of memory cells indicated by the activated word line is supplied to the column decoder 24. In the program or erase operation, the word lines and bit lines are set to respective predetermined voltage levels in accordance with the type of the operation, thereby injecting or removing electric charge in the memory cells.

The sense amplifier (comparison circuit) 26 compares a level of data with a reference level indicated by the reference cell 27 when the data is supplied from the memory cell array 25 via the column decoder 24, thereby checking whether the data is "0" or "1". The check result is supplied to the output buffer 22 as read data. Verify operation associated with the program operation or the erase operation is also performed by comparing a reference level indicated by the reference cell 27 with a level of data supplied from the memory cell array 25 via the column decoder 24.

The reference cell 27 includes reference cell transistors provided for referencing purposes. The reference cell 27 operates under the control of the command register-&-control circuit 20, and generates a reference level by using the reference cells so as to supply the reference level to the sense amplifier 26 for the purpose of data check.

The threshold value setting circuit 28 operates under the control of the command register-&-control circuit 20, and attends to threshold-level setting processing to set threshold levels to the reference transistors of the reference cell 27.

In the present invention, a plurality of reference cell transistors are combined in the reference cell 27 to generate a Vg-Id characteristic curve to be used for the reference purpose. The threshold value setting circuit 28 supplies to the reference cell transistors a drain voltage, a source voltage, and a gate voltage that are appropriate for setting a desired threshold level to each of the reference transistors.

Figure 4:
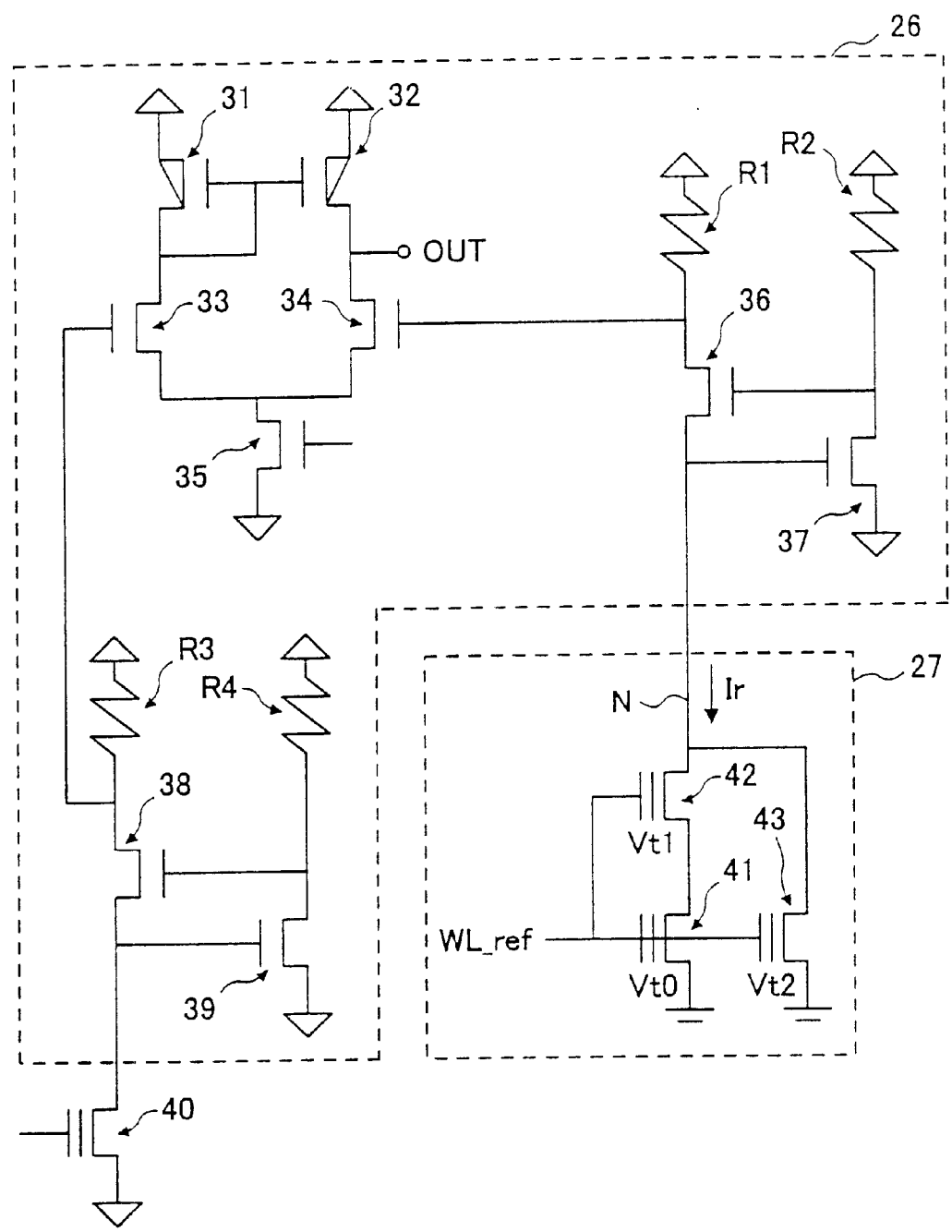
FIG. 4 is a circuit diagram showing a configuration of a first embodiment of a sense amplifier and a reference cell.

FIG. 4 is a circuit diagram showing a configuration of a first embodiment of the sense amplifier 26 and the reference cell 27.

As shown in FIG. 4, the sense amplifier 26 includes a differential amplifier comprised of transistors 31 through 35, a first amplifier circuit comprised of transistors 36 and 37 and resistors R1 and R2, and a second amplifier circuit comprised of transistors 38 and 39 and resistors R3 and R4. The differential amplifier circuit amplifies a voltage difference between the voltage applied to the gate of the transistor 33 and the voltage applied to the gate of the transistor 34, and produces the amplified voltage signal at a node OUT. The gate of the transistor 33 is coupled to a memory cell 40 of the memory cell array 25, and the gate of the transistor 34 is coupled to the reference cell 27.

The reference cell 27 includes a main reference cell transistor 41, a first adjustment-purpose reference cell transistor 42, and a second adjustment-purpose reference cell transistor 43. The main reference cell transistor 41 and the first adjustment-purpose reference cell transistor 42 are connected in series, and this series connection of transistors is connected in parallel to the second adjustment-purpose reference cell transistor 43.

The gates of the cell transistors 41 through 43 receive the voltage level WL_ref. An electric current running through a signal line N is represented as Ir. The threshold voltage level of the main reference cell transistor 41 is represented as Vt0, the threshold voltage level of the first adjustment-purpose reference cell transistor 42 denoted as Vt1, and the threshold voltage level of the second adjustment-purpose reference cell transistor 43 being denoted as Vt2.

As a first step, the threshold voltage level Vt0 of the main reference cell transistor 41 is set to a desired level. Then, the threshold voltage level Vt1 of the first adjustment-purpose reference cell transistor 42 is set equal to about 0V, so that the effect of the first adjustment-purpose reference cell transistor 42 is ignorable in the series connection of the main reference cell transistor 41 and the first adjustment-purpose reference cell transistor 42. The threshold voltage level Vt2 of the second adjustment-purpose reference cell transistor 43 is set to a voltage level substantially greater than the threshold voltage level Vt1 (i.e., Vt2>>Vt1). This insures that no electric current runs through the second adjustment-purpose reference cell transistor 43 during read operation.

When settings are made as described above, the effect of the first adjustment-purpose reference cell transistor 42 and the second adjustment-purpose reference cell transistor 43 can be hidden behind the characteristics of the main reference cell transistor 41. Namely, when the voltage level WL_ref is gradually increased from 0V, an electric current starts running through the series connection of the main reference cell transistor 41 and the first adjustment-purpose reference cell transistor 42 as the voltage level WL_ref reaches the threshold voltage level Vt0 of the main reference cell transistor 41. Assuming that the first adjustment-purpose reference cell transistor 42 is in a completely conductive state at this point, the relationship between the voltage level WL_ref and the electric current Ir directly reflects the characteristic curve of the main reference cell transistor 41. When the voltage level WL_ref exceeds the threshold voltage level Vt2 of the second adjustment-purpose reference cell transistor 43, the main reference cell transistor 41 is almost completely conductive, so that the characteristics of the second adjustment-purpose reference cell transistor 43 connected in parallel to the main reference cell transistor 41 can be ignored.

Accordingly, if the overall Vg-Id characteristic curve of the reference cell 27 is measured, i.e., if the relationship between the voltage level WL_ref and the electric current Ir of the reference cell 27 is measured, the result of measurement directly reflects the Vg-Id characteristic curve of the main reference cell transistor 41.

The slope of the overall Vg-Id characteristic curve of the reference cell 27 is compared with the slope of the Vg-Id characteristic curve of a memory cell. If these slopes do not match, the slope of the Vg-Id characteristic curve of the reference cell 27 will be adjusted as described in the following.

Figure 5:
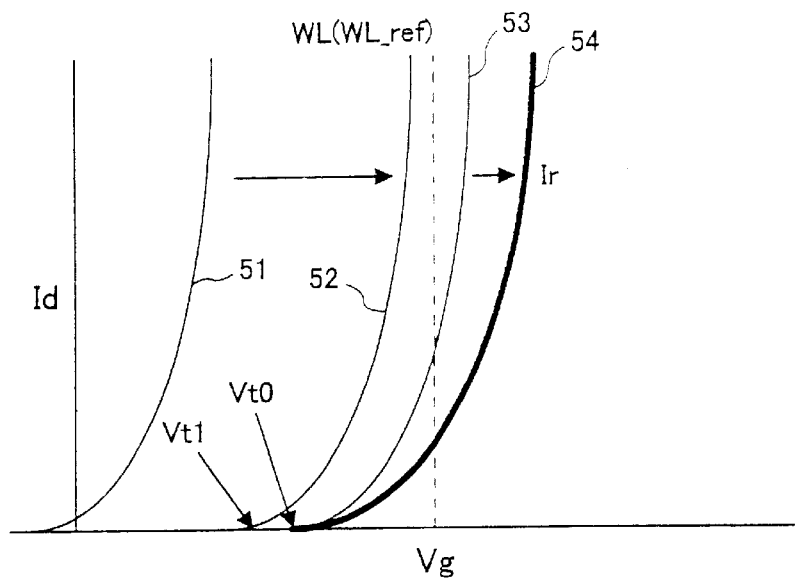
FIG. 5 is an illustrative drawing for explaining how to adjust the Vg-Id characteristic curve of the reference cell.

FIG. 5 is an illustrative drawing for explaining how to adjust the Vg-Id characteristic curve of the reference cell 27.

Figure 1:
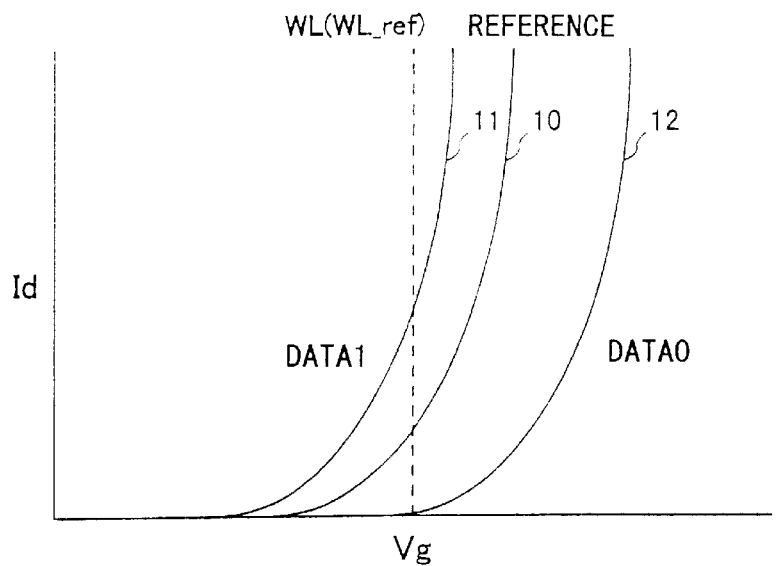
FIG. 1 is a diagram showing Vg-Id characteristics of cell transistors under an ideal situation.
Figure 2:
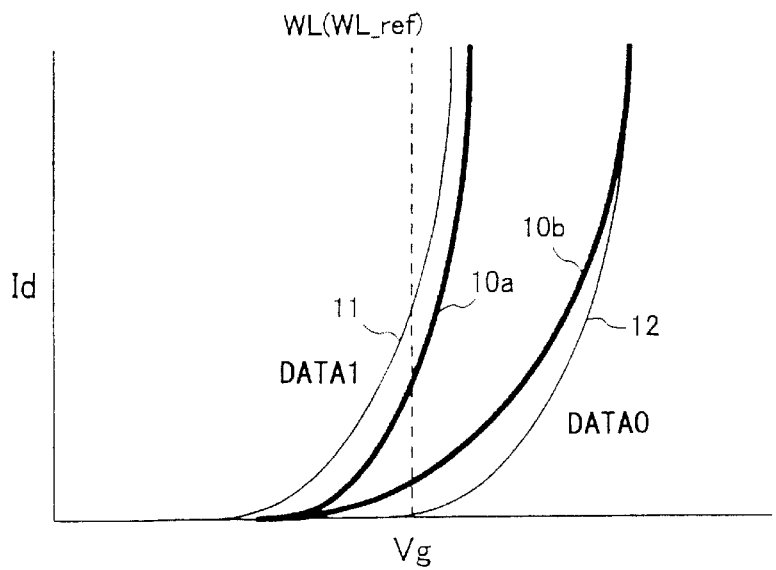
FIG. 2 is a diagram showing Vg-Id characteristics of cell transistors under a situation that is not ideal.

FIG. 5 shows a case in which the Vg-Id characteristic curve of the reference cell 27 is adjusted when the Vg-Id characteristic curve of the reference cell 27 has a slope greater than an ideal slope as in the case of the characteristic curve 10a shown in FIG. 2. In such a case, the threshold voltage levels of the main reference cell transistor 41 and the second adjustment-purpose reference cell transistor 43 are kept fixed. With these threshold voltage levels being fixed, the threshold voltage level Vt1 of the first adjustment-purpose reference cell transistor 42 is gradually increased from the vicinity of 0 V (while keeping the condition of Vt1<Vt0). As the threshold voltage level Vt1 is increased, the Vg-Id characteristic curve of the first adjustment-purpose reference cell transistor 42 is shifted from a characteristic curve 51 to a characteristic curve 52. Along with this shift, there is a gradual decrease in the electric current that runs through the series connection of the main reference cell transistor 41 and the first adjustment-purpose reference cell transistor 42. As a result, the electric current Ir gradually decreases while the overall threshold voltage level Vt0 of the reference cell 27 remains the same. The overall Vg-Id characteristic curve of the reference cell 27 is thus transformed from a characteristic curve 53 to a characteristic curve 54, thereby producing a desired characteristic curve having a relatively small slope.

Figure 6:
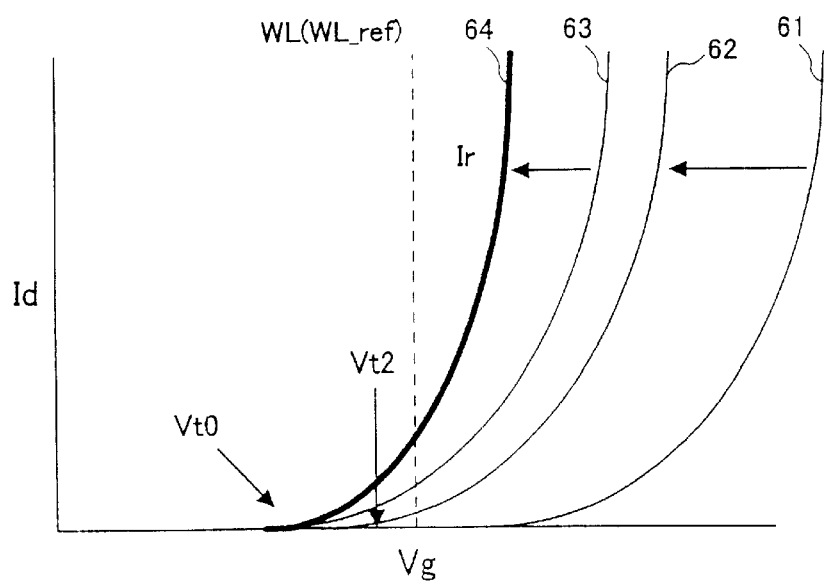
FIG. 6 is an illustrative drawing for explaining how to adjust the Vg-Id characteristic curve of the reference cell.

FIG. 6 is an illustrative drawing for explaining how to adjust the Vg-Id characteristic curve of the reference cell 27.

FIG. 6 shows a case in which the Vg-Id characteristic curve of the reference cell 27 is adjusted when the Vg-Id characteristic curve of the reference cell 27 has a slope smaller than an ideal slope as in the case of the characteristic curve 10b shown in FIG. 2. In such a case, the threshold voltage levels of the main reference cell transistor 41 and the first adjustment-purpose reference cell transistor 42 are kept fixed. With these threshold voltage levels being fixed, the threshold voltage level Vt2 of the second adjustment-purpose reference cell transistor 43 is gradually decreased from the initial high voltage level (while keeping the condition of Vt0<Vt2). As the threshold voltage level Vt2 is decreased, the Vg-Id characteristic curve of the second adjustment-purpose reference cell transistor 43 is shifted from a characteristic curve 61 to a characteristic curve 62. Along with this shift, there is a gradual increase in the electric current that runs through the second adjustment-purpose reference cell transistor 43. As a result, the electric current Ir gradually increases while the overall threshold voltage level Vt0 of the reference cell 27 remains the same. The overall Vg-Id characteristic curve of the reference cell 27 is thus transformed from a characteristic curve 63 to a characteristic curve 64, thereby producing a desired characteristic curve having a relatively large slope.

As described above, a plurality of reference cell transistors are connected together. Then, the characteristic curve defined by the gate voltage and the electric current running through a predetermined signal line is treated as the characteristic curve of the entire circuitry comprised of the reference cell transistors, thereby collectively providing a voltage versus current characteristic for the reference purpose. Some of the threshold voltage levels of the reference cell transistors are adjusted so as to bring the slope of the voltage versus current characteristic for the reference purpose closer to the slope of the Vg-Id characteristic curve of the memory cell. This achieves a desired reference characteristic.

Figure 7:
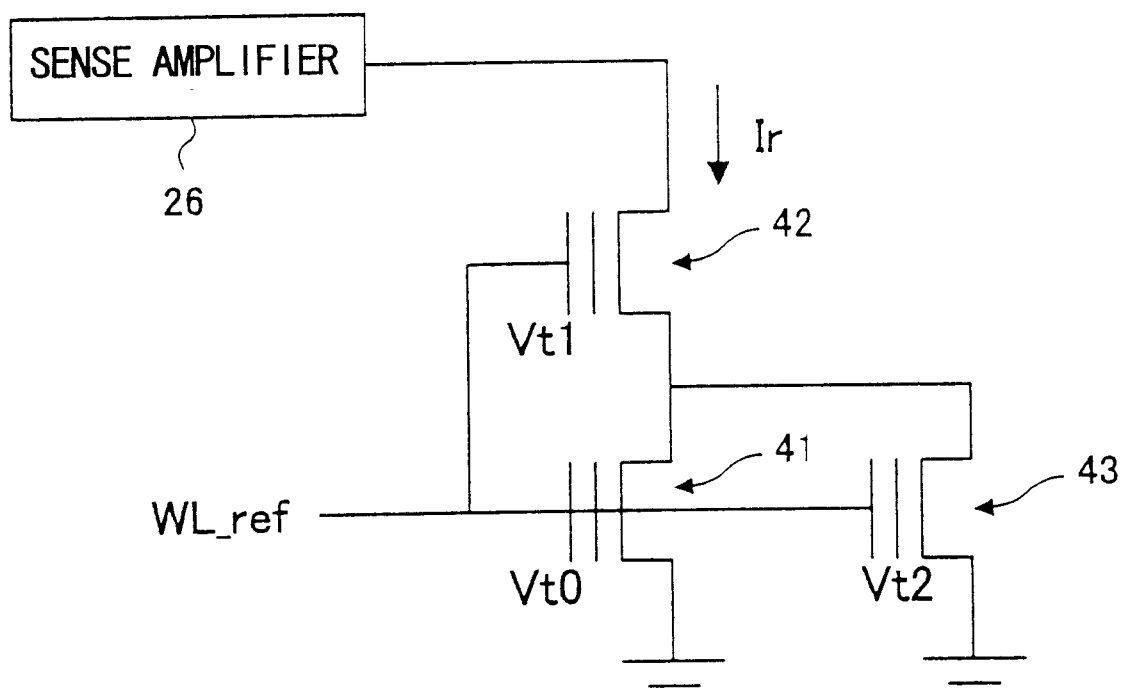
FIG. 7 is a circuit diagram showing a second embodiment of the reference cell.

FIG. 7 is a circuit diagram showing a second embodiment of the reference cell 27. In FIG. 7, the same elements as those of FIG. 4 are referred to by the same numerals, and a description thereof will be omitted.

The reference cell 27 of FIG. 7 differs from the reference cell 27 of FIG. 4 only in the way the second adjustment-purpose reference cell transistor 43 is connected in parallel. In FIG. 4, the second adjustment-purpose reference cell transistor 43 is connected in parallel to the series connection of the main reference cell transistor 41 and the first adjustment-purpose reference cell transistor 42. In FIG. 7, on the other hand, the second adjustment-purpose reference cell transistor 43 is connected in parallel only with the main reference cell transistor 41. This configuration achieves the same operation and function as the configuration of FIG. 4.

Figure 8:
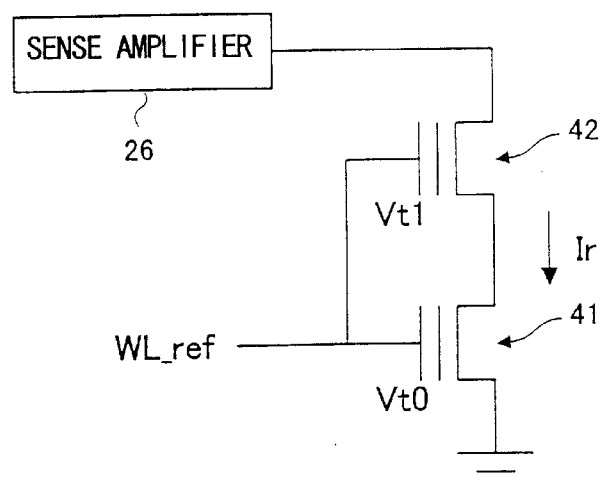
FIG. 8 is a circuit diagram showing a third embodiment of the reference cell.

FIG. 8 is a circuit diagram showing a third embodiment of the reference cell 27. In FIG. 8, the same elements as those of FIG. 7 are referred to by the same numerals, and a description thereof will be omitted.

To form the reference cell 27 shown in FIG. 8, the second adjustment-purpose reference cell transistor 43 is removed from the reference cell 27 shown in FIG. 7. In this configuration of FIG. 8, the slope of the overall voltage versus current characteristic of the reference cell 27 cannot be adjusted to attain an increase in the slope. In the slope adjustment shown in FIG. 6, the threshold voltage level Vt2 of the second adjustment-purpose reference cell transistor 43 is reduced so as to attain an increment in the slope of the overall voltage versus current characteristic of the reference cell 27 from the characteristic curve 63 to the characteristic curve 64. In the configuration of FIG. 8, such adjustment is not attainable. Adjustment of the threshold voltage level of the first adjustment-purpose reference cell transistor 42, however, makes it possible to decrease the slope of the overall voltage versus current characteristic of the reference cell 27 in the same fashion as shown in FIG. 5.

The configuration as shown in FIG. 8 is useful when the characteristic curve of the main reference cell transistor 41, i.e., the overall Vg-Id characteristic curve of the reference cell 27 in the initial state prior to any adjustment, is known in advance to be likely to have a slope larger than that of the ideal Vg-Id characteristic curve. In such a case, a circuit that does not include the second adjustment-purpose reference cell transistor 43 as shown in FIG. 8 may be provided, thereby removing excessive circuit components and making efficient use of a circuit area, which results in cost reduction.

Figure 9:
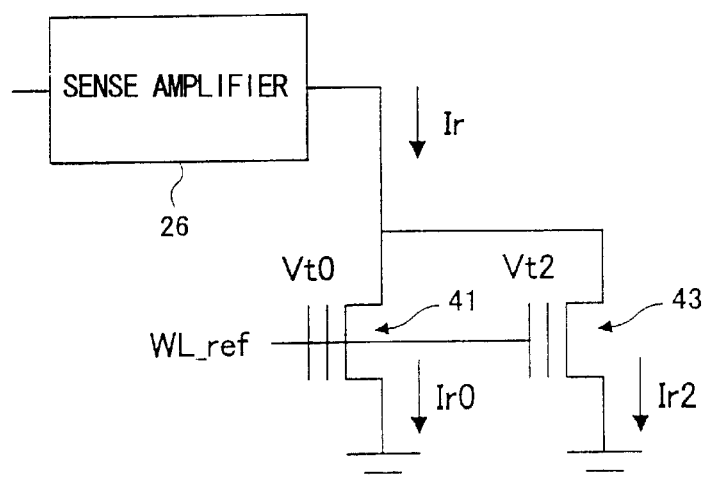
FIG. 9 is a circuit diagram showing a fourth embodiment of the reference cell.

FIG. 9 is a circuit diagram showing a fourth embodiment of the reference cell 27. In FIG. 9, the same elements as those of FIG. 7 are referred to by the same numerals, and a description thereof will be omitted.

To form the reference cell 27 shown in FIG. 9, the first adjustment-purpose reference cell transistor 42 is removed from the reference cell 27 shown in FIG. 7. In this configuration of FIG. 9, the slope of the overall voltage versus current characteristic of the reference cell 27 cannot be adjusted to attain a decrease in the slope. In the slope adjustment shown in FIG. 5, the threshold voltage level Vt1 of the first adjustment-purpose reference cell transistor 42 is raised so as to attain a decrease in the slope of the overall voltage versus current characteristic of the reference cell 27 from the characteristic curve 53 to the characteristic curve 54. In the configuration of FIG. 9, such adjustment is not attainable. Adjustment of the threshold voltage level of the second adjustment-purpose reference cell transistor 43, however, makes it possible to increase the slope of the overall voltage versus current characteristic of the reference cell 27 in the same fashion as shown in FIG. 6.

The configuration as shown in FIG. 9 is useful when the characteristic curve of the main reference cell transistor 41, i.e., the overall Vg-Id characteristic curve of the reference cell 27 in the initial state prior to any adjustment, is known in advance to be likely to have a slope smaller than that of the ideal Vg-Id characteristic curve. In such a case, a circuit that does not include the first adjustment-purpose reference cell transistor 42 as shown in FIG. 9 may be provided, thereby removing excessive circuit components and making efficient use of a circuit area, which results in cost reduction.

Figure 10:
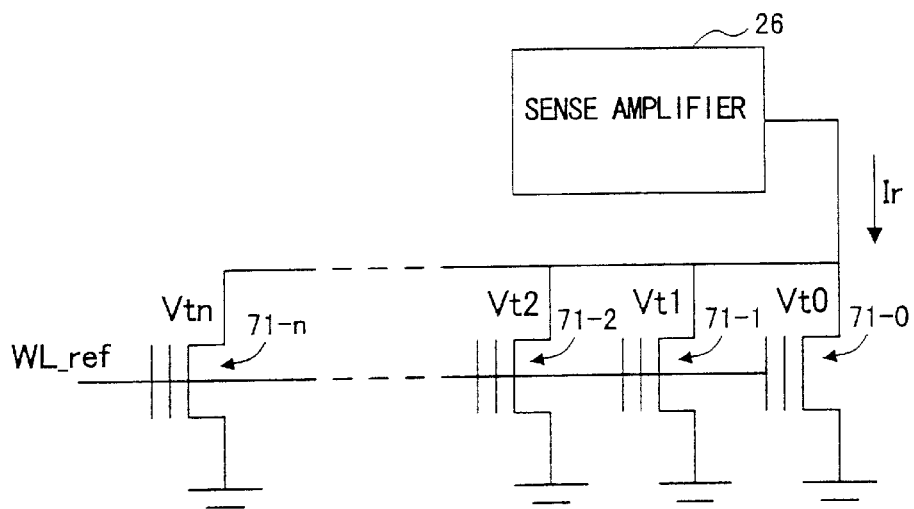
FIG. 10 is a circuit diagram showing a fifth embodiment of the reference cell.

FIG. 10 is a circuit diagram showing a fifth embodiment of the reference cell 27.

The reference cell 27 of FIG. 10 includes a plurality of reference cell transistors 71-0 through 71-n that are connected in parallel. The reference cell transistors 71-0 through 71-n have respective threshold voltage levels Vt0 through Vtn. Each of the threshold voltage levels may be set to different levels.

Figure 11:
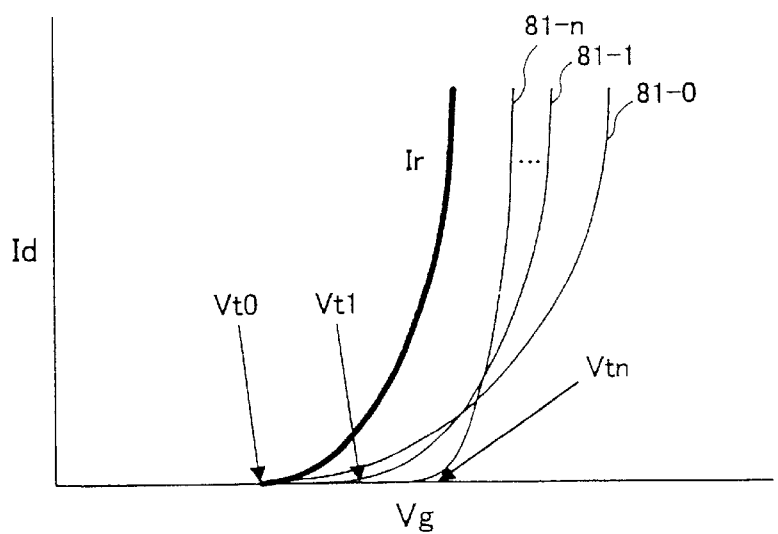
FIG. 11 shows an example of Vg-Id characteristic curves of the reference cell transistors shown in FIG. 10.

FIG. 11 shows an example of respective Vg-Id characteristic curves 81-0 through 81-n of the reference cell transistors 71-0 through 71-n. In FIG. 11, the reference cell transistors 71-0 through 71-n have the respective threshold voltage levels Vt0 through Vtn thereof arranged in an ascending order from their minimum level to their maximum level.

In the configuration of FIG. 10, a predetermined gate voltage Vg (WL_ref) is applied to the gate of each reference cell transistor, resulting in some of the reference cell transistors becoming conductive, with the number of conductive transistors being in accordance with the settings of the threshold voltage levels Vt0 through Vtn. When this happens, the electric current Ir running into the reference cell 27 is a sum of the electric currents running through the conductive reference cell transistors. By adjusting the threshold voltage levels of the reference cell transistors 71-0 through 71-n, it is possible to freely change the overall voltage versus current characteristic of the reference cell 27, thereby making it match the Vg-Id characteristic curve of the memory cell.

Figure 12:
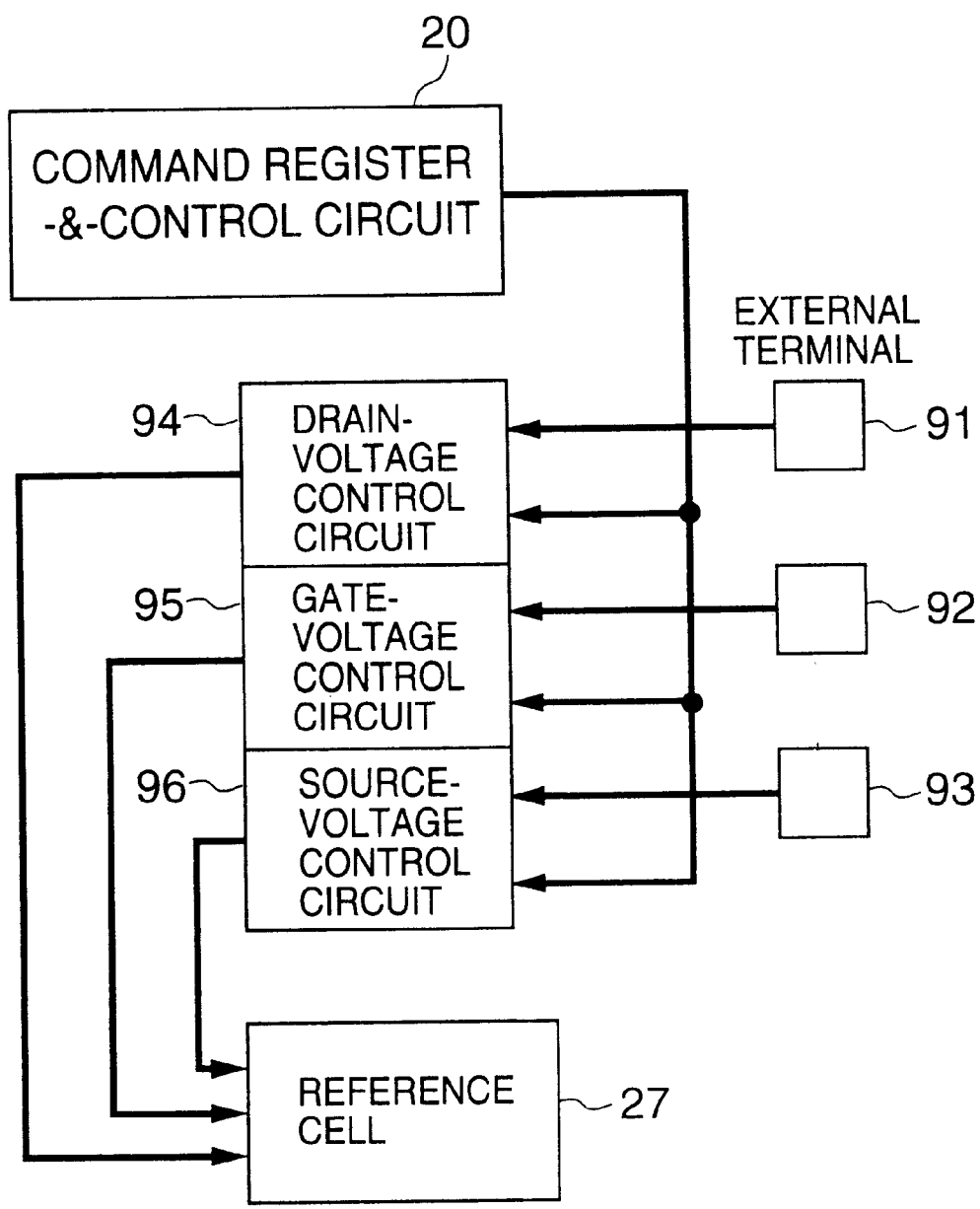
FIG. 12 is a block diagram of a threshold value setting circuit for setting threshold voltage levels to the reference cell.

FIG. 12 is a block diagram of the threshold value setting circuit 28 for setting threshold voltage levels to the reference cell 27.

As shown in FIG. 12, the threshold value setting circuit 28 for setting threshold voltage levels to the reference cell 27 includes external terminals 91 through 93, a drain-voltage control circuit 94, a gate-voltage control circuit 95, and a source-voltage control circuit 96.

As is well known in the field of nonvolatile semiconductor memory devices, a change in a threshold voltage level of a cell transistor can be made by performing a program operation for injecting electric charge into the cell transistor or an erase operation for removing electric charge from the cell transistor. These operations can be carried out by applying proper voltage levels to the gate node, the source node, and the drain node of the reference cell transistors.

The external terminals 91 through 93 receive the drain voltage, the gate voltage, and the source voltage, respectively, from the exterior of the semiconductor memory device, and supply these respective voltage levels to the drain-voltage control circuit 94, the gate-voltage control circuit 95, and the source-voltage control circuit 96. The drain-voltage control circuit 94, the gate-voltage control circuit 95, and the source-voltage control circuit 96 operate under the control of the command register-&-control circuit 20, and supplies the received voltage levels to the reference cell 27 when an instruction is given to set threshold voltage levels to the reference cell 27. In the reference cell 27, the drain voltage level, the gate voltage level, and the source voltage level supplied thereto are applied to a reference cell transistor that is to be adjusted, thereby setting a threshold voltage level.

Figure 13:
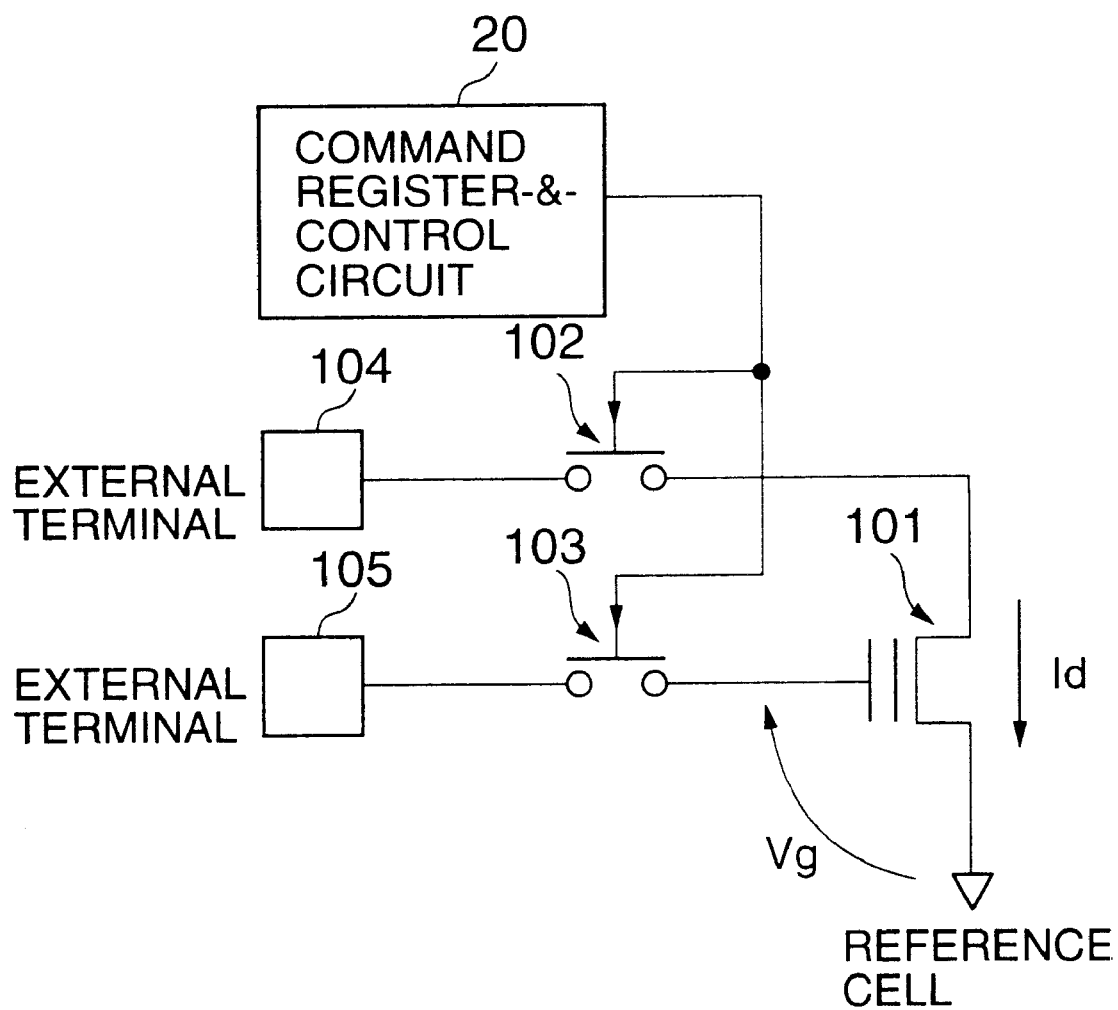
FIG. 13 is an illustrative drawing showing a configuration for measuring the Vg-Id characteristic curve of a reference cell transistor.

FIG. 13 is an illustrative drawing showing a configuration for measuring the Vg-Id characteristic curve of the reference cell transistor.

In FIG. 13, the configuration that is used to measure the Vg-Id characteristic curve of the reference cell transistor includes switch circuits 102 and 103 and external terminals 104 and 105. The reference cell transistor that is to be measured is shown as a reference cell transistor 101. When the overall voltage versus current characteristic of the reference cell 27 needs to be measured, the reference cell 27 is provided in place of the reference cell transistor 101.

The command register-&-control circuit 20 makes the switch circuits 102 and 103 conductive during the operation mode for measuring the Vg-Id characteristic curve of the reference cell transistor 101. Then, a gate voltage Vg is applied to the external terminal 105, and an electric current Id running through the reference cell transistor 101 is measured through the external terminal 104. Measuring the electric current Id while making gradual changes to the gate voltage Vg makes it possible to measure the Vg-Id characteristic curve of the reference cell transistor 101.

Further, the present invention is not limited to these embodiments, but various variations and modifications may be made without departing from the scope of the present invention.

The present application is based on Japanese priority application No. 2000-356009 filed on Nov. 22, 2000, with the Japanese Patent Office, the entire contents of which are hereby incorporated by reference.

What is claimed is:

1. A nonvolatile semiconductor memory device, comprising:
a reference circuit which includes a plurality of reference cell transistors connected together and receiving a common gate voltage, and includes a signal line having an electric current running therethrough that is a composite of electric currents running through the reference cell transistors in accordance with the gate voltage;
a memory cell array which includes memory cells for storing data therein;
a comparison circuit which compares the electric current running through the signal line with an electric current corresponding to data of one of the memory cells; and
a threshold value setting circuit which adjusts threshold voltage levels of one or more of the reference cell transistors so as to bring a voltage versus current characteristic curve of the gate voltage and the electric current running through the signal line closer to a voltage versus current characteristic curve of the memory cells.

2. The nonvolatile semiconductor memory device as claimed in claim 1, wherein the reference cell transistors of said reference circuit include:
a first reference cell transistor;
a second reference cell transistor connected in series to said first reference cell transistor; and
a third reference cell transistor connected in parallel to the series connection of said first reference cell transistor and said second reference cell transistor, wherein the electric current running through the signal line is a sum of an electric current running through said series connection and an electric current running through said third reference cell transistor.

3. The nonvolatile semiconductor memory device as claimed in claim 1, wherein the reference cell transistors of said reference circuit include:
a first reference cell transistor;
a second reference cell transistor connected in series to said first reference cell transistor; and
a third reference cell transistor connected in parallel to said first reference cell transistor, wherein the electric current running through the signal line is an electric current running through said second reference cell transistor.

4. The nonvolatile semiconductor memory device as claimed in claim 1, wherein the reference cell transistors of said reference circuit include:
a first reference cell transistor; and
a second reference cell transistor connected in series to said first reference cell transistor, wherein the electric current running through the signal line is an electric current running through the series connection of said first reference cell transistor and said second reference cell transistor.

5. The nonvolatile semiconductor memory device as claimed in claim 1, wherein the reference cell transistors of said reference circuit include:
a first reference cell transistor; and
a second reference cell transistor connected in parallel to said first reference cell transistor, wherein the electric current running through the signal line is a sum of an electric current running through said first reference cell transistor and an electric current running through said second reference cell transistor.

6. The nonvolatile semiconductor memory device as claimed in claim 1, wherein the reference cell transistors of said reference circuit are connected in parallel, and said signal line is connected in series to the parallel connection of the reference cell transistors.

7. A nonvolatile semiconductor memory device, comprising:
a plurality of reference cell transistors connected together and receiving a common gate voltage;
a signal line having an electric current running therethrough that is a composite of electric currents running through the reference cell transistors in accordance with the gate voltage;
a comparison circuit which compares the electric current running through the signal line with an electric current corresponding to data of a memory cell.

8. A method of adjusting a voltage versus current characteristic in a nonvolatile semiconductor memory device which includes a first reference cell transistor, a second reference cell transistor connected in series to the first reference cell transistor, and a third reference cell transistor connected in parallel to the series connection of the first reference cell transistor and the second reference cell transistor, wherein a common gate voltage is applied to gates of the first through third reference cell transistors, and an electric current corresponding to data of a memory cell is compared with an electric current that is a sum of an electric current running through the series connection and an electric current running through the third reference cell transistor, said method comprising:
setting threshold voltage levels Vt0, Vt1, and Vt2 of the first, second, and third respective reference cell transistors such that Vt1<Vt0<Vt2; and
adjusting one of the threshold voltage levels Vt1 and Vt2 while maintaining Vt1<Vt0<Vt2, thereby adjusting a slope of a voltage versus current characteristic defined by the gate voltage and the electric current that is said sum.

9. A method of adjusting a voltage versus current characteristic in a nonvolatile semiconductor memory device which includes a first reference cell transistor, a second reference cell transistor connected in series to the first reference cell transistor, and a third reference cell transistor connected in parallel to the first reference cell transistor, wherein a common gate voltage is applied to gates of the first through third reference cell transistors, and an electric current corresponding to data of a memory cell is compared with an electric current running through the second reference cell transistor, said method comprising:

setting threshold voltage levels $Vt0$, $Vt1$, and $Vt2$ of the first, second, and third respective reference cell transistors such that $Vt1<Vt0<Vt2$; and adjusting one of the threshold voltage levels $Vt1$ and $Vt2$ while maintaining $Vt1<Vt0<Vt2$, thereby adjusting a slope of a voltage versus current characteristic defined by the gate voltage and the electric current running through the second reference cell transistor.

* * * * *